(12) United States Patent
Pinto et al.

(10) Patent No.: US 6,198,154 B1
(45) Date of Patent: Mar. 6, 2001

(54) PNP LATERAL BIPOLAR ELECTRONIC DEVICE

(75) Inventors: Angelo Pinto, Augusta; Carlo Alemanni, Acireale, both of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/087,421

(22) Filed: May 29, 1998

(30) Foreign Application Priority Data

May 30, 1997 (EP) .................................... 967830257

(51) Int. Cl.$^7$ .................. H01L 27/082; H01L 27/102; H01L 29/70; H01L 31/11; H01L 29/00

(52) U.S. Cl. ................ 257/575; 257/576; 257/557; 257/562; 257/563

(58) Field of Search .................... 257/557, 575, 257/558, 559, 576, 562, 563

(56) References Cited

U.S. PATENT DOCUMENTS

| | | | |
|---|---|---|---|
| 4,115,797 | * | 9/1978 | Hingarh et al. ........... 357/46 |
| 4,220,961 | * | 9/1980 | Werner ................... 357/46 |
| 5,347,156 | * | 9/1994 | Sakaue .................. 257/575 |
| 5,734,183 | * | 3/1998 | Morishita ............... 257/197 |
| 5,796,157 | * | 8/1998 | Fallico et al. .......... 257/557 |

FOREIGN PATENT DOCUMENTS

| | | | |
|---|---|---|---|
| 0 039 411 A2 | 11/1981 | (EP) | ............. H01L/27/08 |
| 0 435 308 A1 | 12/1990 | (EP) | ............. H01L/29/73 |
| 0 709 896 A1 | 5/1996 | (EP) | ............ H01L/29/735 |
| 02040922 | 2/1990 | (JP) | ............ H01L/21/331 |

* cited by examiner

*Primary Examiner*—Mahshid Saadat
*Assistant Examiner*—Jesse A. Fenty
(74) *Attorney, Agent, or Firm*—Theodore E. Galanthay; Robert Iannucci; Seed IP Law Group, PLLC

(57) ABSTRACT

A lateral PNP bipolar electronic device integrated monolithically on a semiconductor substrate together with other NPN bipolar devices capable of being operated at high frequencies. The PNP device is incorporated to an electrically insulated multilayer structure which comprises a semiconductor substrate, doped for conductivity of the P-type, a first buried layer, doped for conductivity of the N-type to provide a base region, and a second layer, overlying the first and having conductivity of the N-type, to provide an active area distinguishable by a P-doped emitter region within the active area being located peripherally and oppositely from a P-doped collector region. The lateral PNP device can be operated at high frequencies with suitable collector current values and good amplification, to provide a superior figure of merit compared to that typical of conventional lateral PNP devices.

8 Claims, 4 Drawing Sheets

PNP LATERAL BIPOLAR ELECTRONIC DEVICE

TECHNICAL FIELD

This invention relates to a PNP bipolar electronic device.

In particular, the invention relates to a lateral PNP bipolar electronic device which is integrated monolithically on a semiconductor substrate together with other bipolar devices of the NPN type.

BACKGROUND OF THE INVENTION

As is well known, NPN transistors are preferred for implementing integrated circuitry of the bipolar type on semiconductor substrates, on account of their DC and AC amplifications being definitely better than those of PNP transistors.

Another disadvantage of PNP bipolar transistors is their close limitations in high frequency applications.

Despite all this, the inclusion of both NPN and PNP transistors on a common semiconductor substrate is still a necessity where suitable bias circuits, current mirror circuits and/or load devices for gain stages are to be provided.

The formation of PNP transistors on a semiconductor substrate is effected concurrently with that of NPN transistors, without any additional implanting or masking steps.

It is for this reason that it has become common practice to form PNP bipolar transistors of the so-called lateral type such that they can be compatible with the process flows adopted to fabricate NPN bipolar devices.

In this respect, FIG. 1 shows an enlarged cross-sectional view, taken on a vertical plane, of a sidewall PNP device 6 formed on a P-doped semiconductor substrate 1.

The following are successively deposited onto this substrate 1: a first buried layer 2 doped N+ to form the base region of the transistor, and a second layer 3, doped N, which constitutes the active area of the PNP device to be.

Thereafter, a selective diffusion of P-type dopants is realized in the active area 3 to define a central emitter region 4 surrounded by two opposite collector regions 5.

This solution has been widely used heretofore, to the point that a text, "Design and Realization of Bipolar Transistors", Peter Ashburn, page 157, gives it as the principal configuration for a lateral PNP device that can ensure of a good current gain.

It should be noted that such lateral PNP transistors have an intrinsic current loss of about 3% compared to collector current; these currents can also be explained theoretically by having reference to the diagram in FIG. 2 of an equivalent electric circuit of a lateral PNP transistor.

It can be seen in this figure that the lateral PNP device, designated $Q_1$ in the equivalent circuit, is connected to a pair of parasitic PNP transistors $Q_2$ and $Q_3$ having their respective emitter regions connected to the emitter and collector regions of the transistor $Q_1$.

In addition, these parasitic devices $Q_2$ and $Q_3$ have their collector regions connected to the semiconductor substrate, and their base regions in common with the base of $Q_1$.

This equivalent electric diagram shows that the parasitic currents are mainly attributable to the second parasitic device $Q_2$ draining toward the substrate some of the current being injected by the emitter of $Q_1$, thereby lowering the efficiency of lateral emission.

Similar considerations apply to the third parasitic device $Q_3$, which contributes instead to lowering the collection efficiency of the collector of $Q_1$ when the latter is biased to its saturation range.

To overcome drawbacks of this kind, tied to the parasitic currents, a conventional solution has been that of optimizing the collection efficiency of the carriers in the collector region, so as to maximize the gain of lateral transistors.

For this reason, lateral PNP transistors have been implemented conventionally with their emitter region occupying, in the active area, a central location surrounded by two collector regions.

While being in many ways advantageous, this prior solution has a serious drawback in that it leads to increased values of certain characteristic parameters of the lateral PNP device, such as the base-collector and emitter-base capacitances, $C_{bc}$ and $C_{eb}$, which restrict performance at high frequencies.

This drawback is also connected with the considerable spread of the base region in the buried layer brought about by the need to control the lateral PNP device performance in the emitter and collector regions.

Especially the width $W_b$ of this base region adversely affects the carrying parameter B*, which is tied to $W_b$ by the following formula:

$$B^* \approx 1 - \frac{W_b^2}{2D\tau} \quad (1.1)$$

where D is the diffusion value, and $\tau$ is the re-combination time of the carriers.

It should be noted that the B* factor is inversely proportional to the passage time through the base region, so that as it increases, the frequency performance of the lateral PNP device deteriorates.

Unfortunately, this type of lateral PNP device revealed serious limitations when attempts were made to improve its high frequency performance.

These limitations come from the practical impossibility of bringing the collector regions closer to the central emitter region.

This is both attributable to the photolithographic masks used for transferring the patterns of the active region, and side diffusion effects during the formation of the emitter and collector regions, as well as to breakdown effects which may occur in the region between the base and the collector.

As a result, the width $W_b$ of the base region of the lateral PNP transistors always exhibits values between 2 μm and 4 μm.

Another problem to be taken into account is that the central emitter region includes neighboring regions with a predetermined width $E_c$, due to the "bird's beak" phenomenon.

These regions cause the minimum width $W_{AA}$ of the active area required for containing the central emitter region (see example in FIG. 7) to be increased, which further harms the device performance.

Thus, it has become good designing practice to never put an active area minimum width $W_{AA}$ at anything below the limit given by the following formula (1.2), taking account of the actual width of the emitter contact region CNTWidth and of the added width $E_C$ due to the "bird's beak".

$$W > CNTWidth + 2*Ec \quad (1.2)$$

To this regard, the electron microphotograph of FIG. 3 comes useful which shows an enlarged cross-section through a typical lateral PNP device taken near the central emitter region.

In the present instance, it can be seen that the "bird's beak" inside the active area extends for about 0.6 μm and, therefore, requires a minimum width $W_{AA}$ greater than about 2.6 μm.

SUMMARY OF THE INVENTION

An embodiment of this invention provides a new topography conferring, on a lateral PNP device, such structural and functional features as to make it suitable for high frequency applications as well, thereby overcoming the aforesaid limitations and drawbacks.

An embodiment of this invention provides a lateral PNP device topography which is compatible with NPN process flows and allows an emitter region to be located peripherally of the active area of the device rather than centrally.

In one embodiment of the invention, an electronic device is incorporated into an electrically insulated multilayer structure. The electronic device comprises a semiconductor substrate doped with impurities of the P-type, a first buried layer doped with impurities of the N-type to provide a base region, and a second layer, overlying the first and having conductivity of the N-type, to provide an active area wherein a P-type emitter region is located peripherally in the active area at an opposite location from a P-type collector region.

It thus becomes possible to improve those characterizing parameters of PNP devices that previously imposed restrictions on their use at high frequencies.

Advantageously, the design of the lateral PNP device of this invention provides a better figure of merit than conventional lateral PNP transistors.

The features and advantages of the inventive device will be apparent from the following description of an embodiment thereof, given by way of non-limitative example with reference to the accompanying drawings.

DETAILED DESCRIPTION OF THE INVENTION

Figure 1:
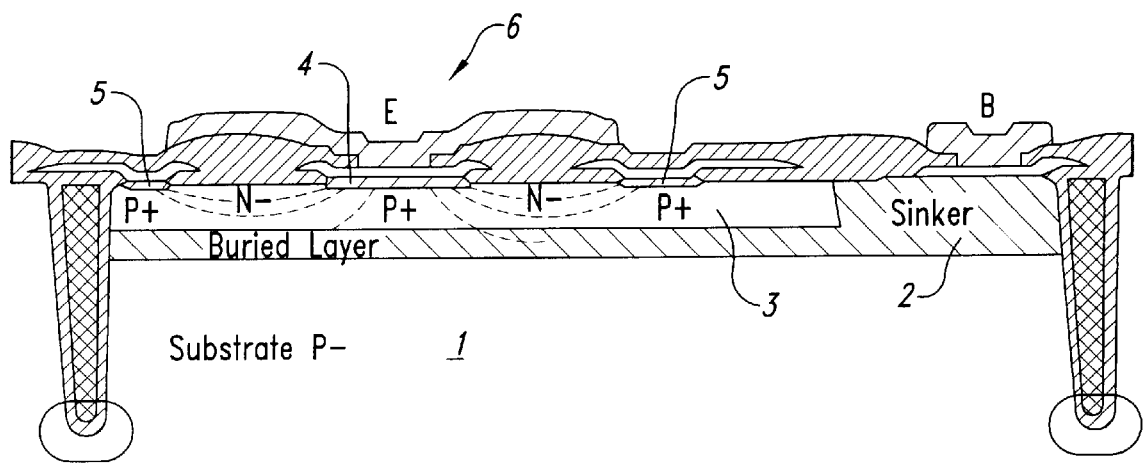
FIG. 1 is an enlarged-scale sectional view taken on a vertical plane of a lateral PNP device integrated on a semiconductor substrate, according to the prior art.
Figure 2:
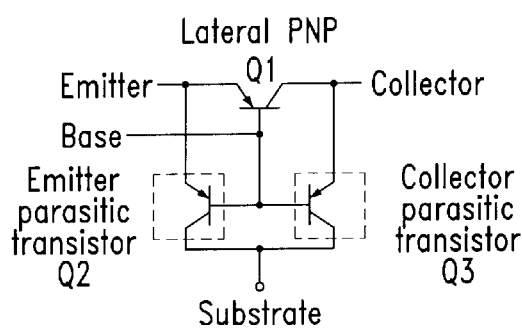
FIG. 2 shows a schematic equivalent electric circuit of a lateral PNP device integrated on a semiconductor substrate, according to the prior art.
Figure 3:
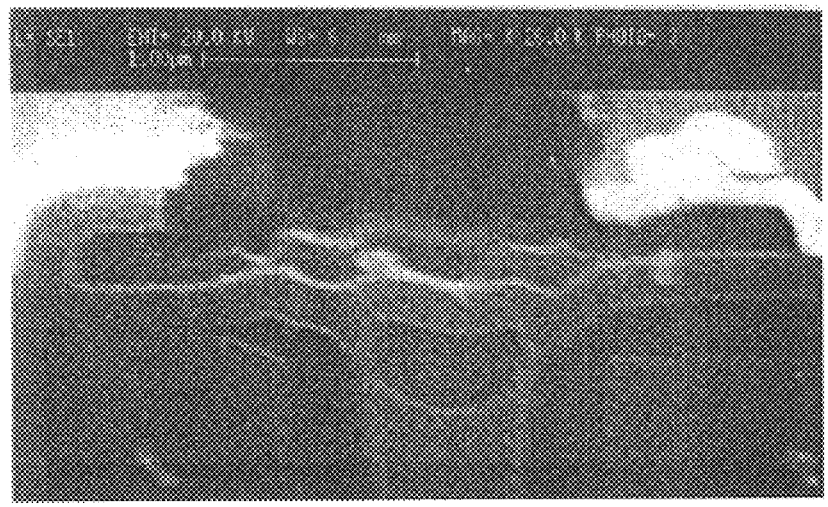
FIG. 3 is an electron microphotograph of a central emitter region of a prior art lateral PNP device.
Figure 4:
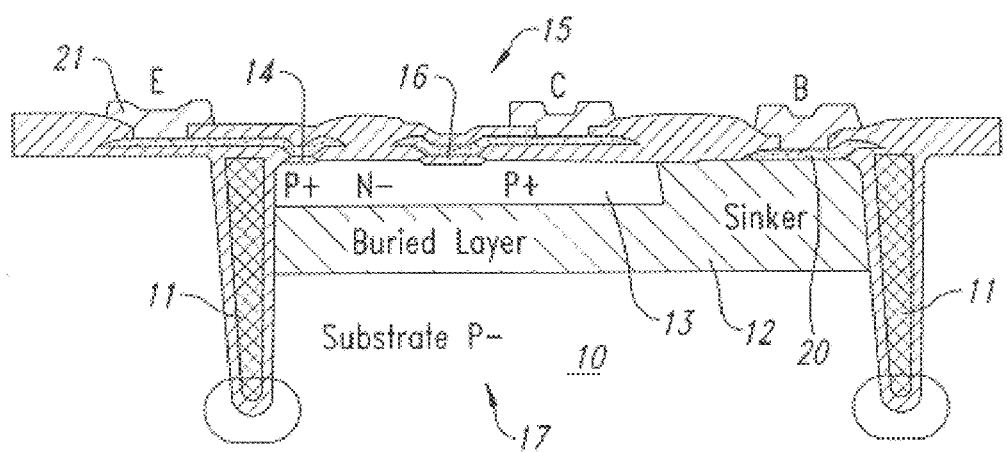
FIG. 4 is an enlarged-scale sectional view taken on a vertical plane of a lateral PNP device integrated on a semiconductor substrate, according to the invention.

Referring to FIG. 4, a preferred embodiment of a lateral PNP device 15, monolithically integrated on a semiconductor substrate together with other NPN devices (not shown because conventional), which can also be operated at high frequencies, will be described.

A multilayer structure 17, electrically isolated from any other integrated device by the selective growing of isolation oxide regions 11, has been formed on a P-doped semiconductor substrate 10.

This multilayer structure is produced by the successive deposition, onto the substrate 10, of a first buried layer 12 doped for conductivity of the N-type to form a base region, and of a second layer 13 with conductivity of the N-type which represents an active area of the lateral PNP device 15.

The fabrication process includes the definition of an emitter region 14 and a collector region 16. To define the emitter and collector regions 14, 16, a first step of selectively diffusing P-type dopants is carried out onto the surface of the active area.

At the end of this operation, the emitter region 14 will locate peripherally of the active area 13, opposite from the collector region 16.

To complete the lateral PNP device 15, a second step of diffusing N dopants is carried out so as to have a base region 20 of the first buried layer 12 extend to the top of the multilayer structure.

In order for the lateral PNP device 15 to accommodate any future electric connections to other integrated devices on the substrate 10, a contact forming step is necessary.

This step is carried out conventionally to provide polysilicon electric contacts at the locations of the emitter 14, collector 16 and base 20 regions. The contacts are formed in predetermined areas of the multilayer structure top, taking care to provide an emitter contact 21 externally of the multilayer structure of the PNP device 15 as defined by the isolation oxide regions 11.

The layout described so far has the advantage of reducing the capacitive parameters, $C_{be}$ and $C_{bc}$, associated with the lateral PNP device 15 which were the main cause of limitation to performance at high frequencies.

The solution proposed herein may seem a tradeoff of the collection efficiency brought about by a single collector region 16 (hence, an inferior collector current) in favor of improved performance at high frequencies.

Figure 5:
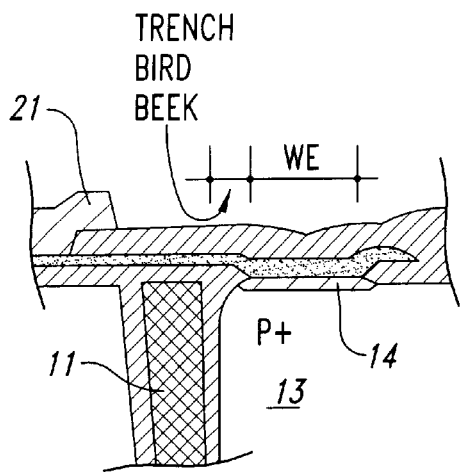
FIG. 5 is an enlarged cross-sectional view of the emitter region of the PNP device according to the invention.
Figure 6:
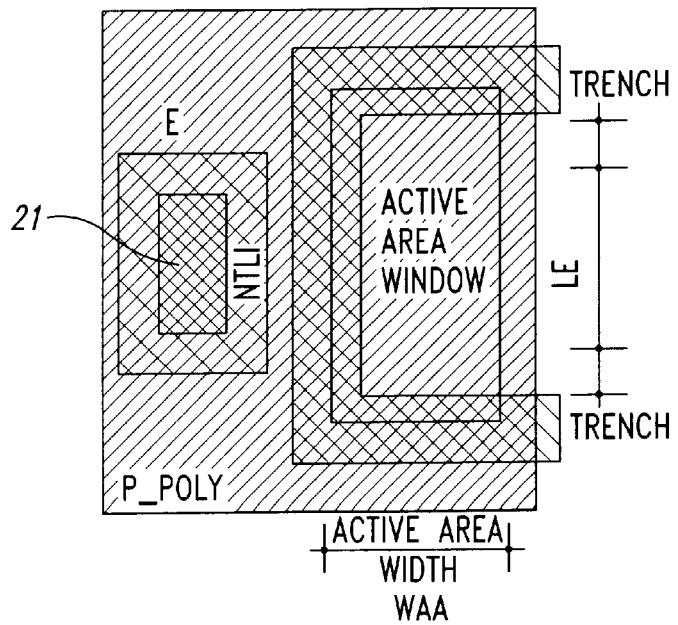
FIG. 6 is a plan view of a semiconductor substrate incorporating the PNP device of this invention which highlights the emitter region thereof.

This potential drawback is illustrated in greater detail by FIGS. 5 and 6, which show a region of the emitter 14 in cross-section and plan views, respectively.

The emitter region 14 is preferably rectangular in plan form, with a width We smaller than its length $L_e$. This region 14 locates opposite from the central collector region 16 (omitted from FIGS. 5 and 6).

In this way, the "lateral transistor effect" has been improved, and the collector current increased accordingly, since both these effects benefit from an elongate geometry of the emitter region 14.

It should also be noted that this geometry of the emitter region 14 has added advantages to further reduce the value of the capacitive parameter $C_{eb}$ and to reduce current leakage toward the substrate 10.

The results of tests carried out by the Applicants with the lateral PNP device 15 have confirmed advantages of this solution.

In particular, it has been possible to ascertain that an optimum condition is achieved with a high ratio (P/A) of the active periphery P to the surface area A of the emitter region 14.

The term 'active periphery P' is used herein to indicate that portion of the emitter region 14 perimeter which is facing the collector region 16 directly.

In the lateral PNP device 15 of this invention, this P/A ratio can reach very high values, previously unattainable by a standard PNP device having a central emitter region.

More particularly, the P/A ratio is equal to a constant, $1/W_e$, obtained from respective values of P and A equal to $L_e$ and $W_e*L_e$.

Simple calculations, assuming We to be 0.4 μm in one case, and 0.15 μm in another, yield values of P/A of 2.5 μm and 6.7 μm, respectively.

These results are made possible by the proposed configuration providing a peripheral location for the emitter region 14 in the active area, concurrently with moving the emitter contact 21 outside of the multilayer structure 17 defined by the isolation oxide regions 11.

Figure 7:
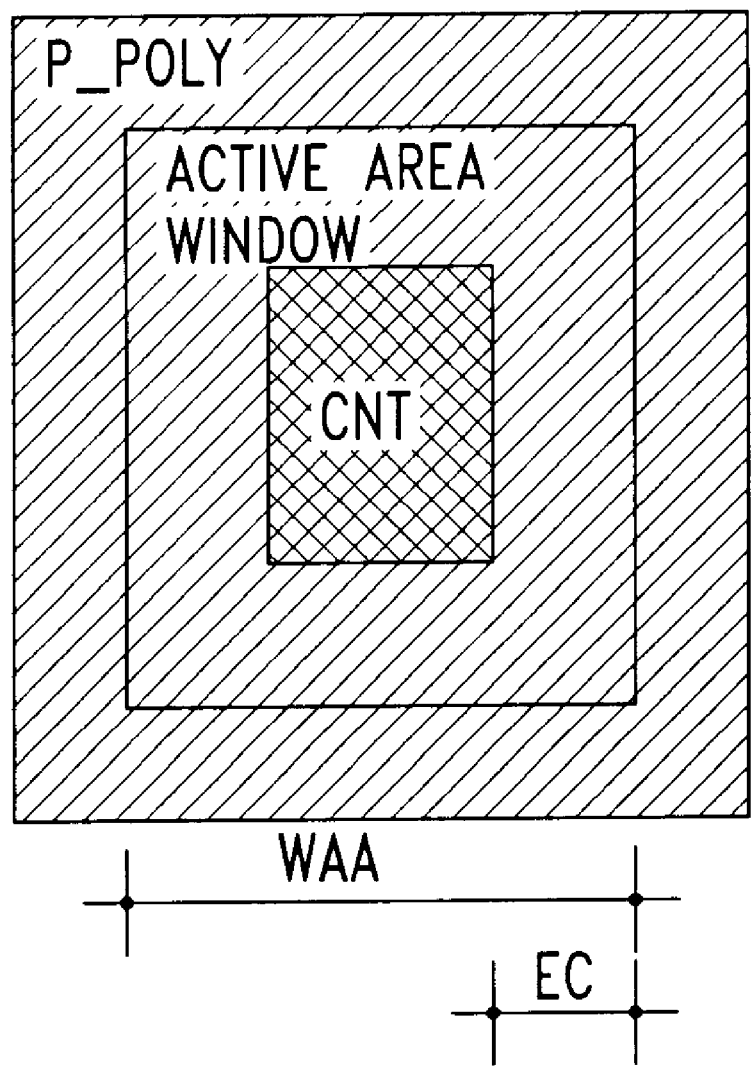
FIG. 7 is a plan view of a semiconductor substrate incorporating a lateral PNP device with a central emitter region, according to the prior art.

It should be noted, in particular, that by having the emitter region 14 moved to the periphery of the active area 13 (see FIGS. 6 and 7), the quantity $W_{AA}$, mentioned under the Background of the Invention heading above, which represents the minimum width for the active area, can be reduced.

This allows the size of the lateral PNP device described hereinabove to be also reduced, thereby further improving its frequency performance.

In conclusion, this lateral PNP device can be operated at high frequencies, with suitable collector current values and good amplification, to provide a superior figure of merit compared to that typical of conventional lateral PNP devices.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A lateral PNP bipolar electronic device integrated monolithically on a semiconductor substrate together with other bipolar devices of the NPN type, said device comprising:

the semiconductor substrate, doped with impurities of the P-type;

a first buried layer in the semiconductor substrate, the first buried layer being doped with impurities of the N-type to provide a base region, being delimited on opposite sides by a pair of insulation regions, and having a sinker region that extends to a surface of the semiconductor substrate;

a second layer, overlying the first buried layer and having conductivity of the N-type, to provide an active area, wherein within said active area, a P-doped emitter region is located along a periphery of the active area at an opposite location from a P-doped collector region;

a base region formed in the sinker region of the first buried layer, the collector region being located between the emitter and base regions; and an emitter contact electrically coupled to the emitter region and positioned completely on an opposite side of one of the insulation regions from the emitter region.

2. The lateral PNP bipolar electronic device according to claim 1 wherein said emitter region has an essentially rectangular plan form.

3. The lateral PNP bipolar electronic device according to claim 2 wherein said emitter region has a first side that faces the collector region and a second side transverse to the first side, the first side being longer than the second side.

4. A lateral PNP bipolar device integrated monolithically on a semiconductor substrate, comprising:

an N-type active area formed above the semiconductor substrate, the active area including a top side extending from a first lateral end to a second lateral end;

a P-type collector region formed at the top side of the active area;

a P-type emitter region formed at the top side of the active area and immediately adjacent to the first lateral end of the active area;

a base region formed in the semiconductor substrate laterally of the active area; the collector region being located between the emitter and base regions; and a dielectric region positioned adjacent to the first lateral end of the active region an emitter contact electrically coupled to the emitter region and positioned completely on an opposite side of the dielectric region from the emitter region.

5. The lateral PNP bipolar device of claim 4 wherein said semiconductor substrate is doped with impurities of the P-type and the lateral PNP bipolar device further includes:

a buried first layer formed on the semiconductor substrate and doped with N-type impurities to provide a base area; and a second layer formed on the first buried layer and doped with N-type impurities to provide the active area.

6. The lateral PNP bipolar device of claim 4 wherein said emitter region is substantially a rectangular form.

7. The lateral PNP bipolar device of claim 6 wherein said emitter region extends along one direction and faces a full length of the oppositely located collector region in the one direction.

8. The lateral PNP bipolar device of claim 6 wherein the emitter region includes first and second sides, the first side facing a side of the collector region and being longer than the second side.

* * * * *

UNITED STATES PATENT AND TRADEMARK OFFICE
CERTIFICATE OF CORRECTION

PATENT NO. : 6,198,154 B1  Page 1 of 1
DATED : March 6, 2001
INVENTOR(S) : Angelo Pinto et al.

It is certified that error appears in the above-identified patent and that said Letters Patent is hereby corrected as shown below:

<u>Title page,</u>
Item [30], the foreign priority application number should read -- 97830257.8 --.

Signed and Sealed this

First Day of January, 2002

Attest:

Attesting Officer

JAMES E. ROGAN
*Director of the United States Patent and Trademark Office*